United States Patent

[11] 3,599,060

[72] Inventors William M. Triggs
Manlius;
Carl J. Byrns, Jr., Liverpool, both of, N.Y.

[21] Appl. No. 778,647
[22] Filed Nov. 25, 1968
[45] Patented Aug. 10, 1971
[73] Assignee General Electric Company

[54] A MULTILAYER METAL CONTACT FOR SEMICONDUCTOR DEVICE
6 Claims, 6 Drawing Figs.

[52] U.S. Cl. .......... 317/234 R, 317/235 R, 27/589, 317/234 M, 317/235 D
[51] Int. Cl. .......... H01l 3/00, H01l 5/00
[50] Field of Search .......... 317/234, 5.3

[56] References Cited
UNITED STATES PATENTS

| | | | |
|---|---|---|---|
| 3,458,925 | 8/1909 | Napier et al. | 29/578 |
| 3,429,029 | 2/1969 | Langden et al. | 29/589 |
| 3,430,104 | 2/1969 | Burgess et al. | 317/101 |
| 2,613,301 | 10/1952 | Dubar et al. | 201/63 |
| 3,465,211 | 9/1969 | Adams | 317/234 |

*Primary Examiner*—John W. Huckert
*Assistant Examiner*—B. Estrin
*Attorneys*—Robert J. Mooney, Carl O. Thomas, Nathan J. Cornfeld, Frank L. Neuhauser and Oscar B. Waddell

ABSTRACT: A semiconductor device comprising a body of semiconductor material having a raised metallic contact on its surface consisting of a bottom region, a middle region, and a top region. The bottom region, which is contiguous with a surface of the semiconductor body, comprises a semiconductor adherence-promoting metallic layer having an upper surface of aluminum. The top region comprises a metallic layer of connectable material to which external electrodes or leads can be easily bonded. The middle region is between the bottom region and the top region and comprises essentially a barrier layer of metallic material. The barrier layer prevents the mixing of the bottom and top regions without deleteriously affecting the electrical and thermal conductivity between these two regions.

INVENTORS:
WILLIAM M. TRIGGS,
CARL J. BYRNS, JR.

BY Robert J. Mooney
THEIR ATTORNEY.

INVENTORS:
WILLIAM M. TRIGGS,
CARL J. BYRNS, JR.
BY Robert J. Mooney
THEIR ATTORNEY.

A MULTILAYER METAL CONTACT FOR SEMICONDUCTOR DEVICE

This invention relates to improvements in semiconductor devices. More particularly, the invention relates to a metal-to-semiconductor connection system for a body of semiconductor material and a method of making the same.

As is well known to those skilled in the art, both aluminum-silicon and aluminum-titanium-silicon contact systems are commonly used to form interconnections, contact pads, and the like on the semiconductor bodies of semiconductor devices. However, both such aluminum systems suffer from a number of disadvantages.

For example, it is known in the prior art that in order to solder tin to an aluminum surface a hydrofluoric acid flux is required in order to overcome the formation of undesired oxide on the aluminum surface. This flux, however, has the disadvantage of attacking any desired oxide layers present on the body of semiconductor material such as protective layers of silicon dioxide or desired layers of glassy materials such as those known in the art as phosphosilicate and borosilicate "-glass." Another disadvantage that arises from using aluminum relates to the formation of the brittle compound $AuAl_2$, heretofore sometimes called "purple plague." This compound is detrimental to device reliability and frequently occurs when aluminum comes in contact with gold at temperatures necessary to assemble the device package, i.e. greater than 250° C. The only way to cope with this problem prior to this invention was to minimize the amount of $AuAl_2$ formed during device assembly.

Accordingly, one object of this invention is to provide a metallic contact system particularly suitable for formation on, or application to, a body of silicon semiconductor material as a connection thereto and which will have a nonoxidizing exposed surface particularly suitable for attachment of electrodes or leads thereto by soldering or the like, without need for preliminary oxide-removal treatment.

Another object of this invention is to provide a metallic contact system particularly suitable for formation on, or application to, a body of silicon semiconductor material as a connection thereto that requires no hydrofluoric acid treatment to prepare the surface for soldering.

Another object of this invention is to provide a metallic contact system of the foregoing character particularly suitable for formation on, or application to, a body of silicon semiconductor material which already has aluminum or aluminum surface contacts thereon, thereby minimizing the cost of obtaining the benefits of such a new contact system.

Another object of this invention is to provide a metallic contact system particularly suitable for formation on, or application to, a body of silicon semiconductor material as a connection thereto and which provides a raised contact pad or boss outstanding from the surface of the semiconductor body beyond adjacent nonconductive regions.

Another object of this invention is to provide a metallic contact system that is not susceptible to forming the compound $AuAl_2$.

Another object of this invention is to provide a raised metallic contact system that is durable, easily manufacturable and particularly suitable for rapid bonding simultaneously with other like contacts, to a set of extending leads.

Another object of this invention is to provide a metallic contact system that is mechanically stable and sufficiently well adhered to its semiconductor pellet to be able to constitute the exclusive support for such semiconductor pellet.

These and other objects of the invention will be apparent from the following description and the accompanying drawings, wherein.

Throughout the several figures of the drawing, identical reference characters are applied to similar elements.

Briefly, a metallic contact in accordance with the present invention is formed on a body of semiconductor material by a composite structure consisting of a plurality of metallic regions. According to the invention, the exact number of regions formed may vary with the choice of method used to fabricate them, as well as with contact performance requirements, and the thickness of connectable metal desirable to meet the bonding or soldering requirements for attachment to the semiconductor body of a support member or electrode lead.

Figure 1:
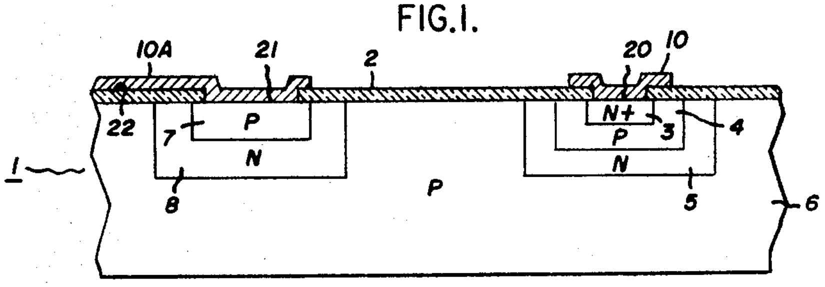
FIGS. 1, 2, 3 and 4 are a series of fragmentary cross-sectional views representing the successive semiconductor structures obtained in the course of providing one preferred embodiment of this invention, with the completed structure shown in FIG. 4.

In a preferred embodiment of the invention, as shown in FIGS. 1 to 4, there is shown one exemplary embodiment of a portion of a semiconductor device 1 comprising a portion of a pellet of silicon semiconductor material provided with a contact in accordance with the invention. The semiconductor device shown in FIGS. 1 to 4 is a portion of a monolithic bipolar integrated circuit. However, the present invention may also be used on a variety of discrete semiconductor devices such as bipolar and unipolar transistors, diodes, thyristors, limited space-charge accumulation devices, and the like. The drawing is not to scale in order to facilitate clarity of understanding of the invention. The two circuit elements illustrated as embodied in the semiconductor device of FIG. 1 are a PN diode including a P-type conductivity anode region 7 and an N-type conductivity cathode region 8, and an NPN transistor including an N-type conductivity emitter region 3, a P-type conductivity base region 4 and an N-typed conductivity collector region 5. The P-type conductivity substrate 6 is used to isolate at least the two above-mentioned diode substrate isolation techniques. The planar junctions of the circuit elements are protected by a protective insulating layer 2 which may be, for example, silicon dioxide. The manufacture of the portions of the semiconductor device 1 thus far described will not be disclosed in detail inasmuch as it does not form a part of this invention and is also well known to those skilled in the art. Moreover, it will be understood that, in addition to active elements such as transistors and diodes, passive elements such as resistors and capacitors may be fabricated within the pellet 1 and included in the circuit, although such are not shown in FIGS. 1 to 4. The present invention will be described in terms of a portion of a single semiconductor pellet which may also constitute only a small portion of a semiconductor wafer, and it will be understood that the procedures to be described may be accomplished on either the pellet or the entire wafer where applicable.

Figure 4:
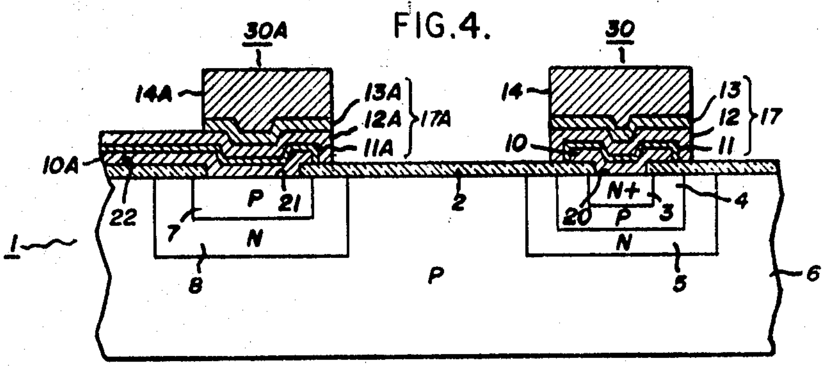

A contact constructed according to our invention is shown at 30 in FIG. 4 on a bodqy of semiconductor material 6. The contact 30 is formed essentially with three regions, one upon the other, and constituting a bottom region 10, a middle region 17, and a top region 14. The bottom region 10, which is contiguous with a surface of the emitter 3, comprises a semiconductor adherence-promoting metallic layer 10 having an upper surface of aluminum. This layer 10 is used to form a well-adhering bond to the semiconductor body. The bottom region 10 shown in FIG. 4 consists of aluminum, but may alternatively consist of one or more metals from the group consisting of aluminum, titanium, vanadium, chromium and intermetallic compounds thereof.

The middle region 17 covers the bottom region 10 and essentially serves as a barrier layer for preventing undesired mixing of the bottom region 10 and top region 14 without deleteriously affecting the electrical and thermal conductivity between the bottom and top regions 10 and 14. It is also used to act as a protective coating for those portions of the bottom region 10 not covered by the top region 14. The middle region 17 is constituted by a barrier layer 12 primarily composed of one or more metals from the group consisting of nickel, electroless nickel (containing less than 10 percent phosphorous), copper, electroless copper and intermetallic compounds thereof. By the term "electroless" is meant a metallic material spontaneously deposited without use of an electrical current by an electroless plating method (i.e. an autocatalytic or self-catalytic reduction of metal ions in an aqueous solution). Further, if desired, the middle region 17 may include additional metallic layers on a portion or the entirety of its upper or lower surfaces to promote adhesion between the middle region 17 and either the top region 14 or bottom region 10, or to facilitate the use of a particular method of applying the top region 14. Middle region 17 of contact 30 constitutes a barrier layer 12 of electroless nickel undercoated with a catalytic layer 11 such as palladium and overcoated with a conductive layer 13 such as silver, which is contiguous with the bottom region 10, and provides a conductive sheet of material to allow the buildup of the top region 14 by electroplating techniques.

The top region 14 covers at least a portion of the middle region 17 and comprises a layer of metallic connectable material 14 to which external electrodes or leads can be easily secured by soldering, bonding, or the like. The connectable material 14 shown is gold, but may be, for example, one or more metals from the group consisting of silver, gold, tin, lead or intermetallic compounds thereof.

The contact 30A includes a bottom region 10A, of aluminum, which is contiguous with the semiconductor region 7 and extends over a portion of the insulating layer 2 at interface 22. The middle region 17A of contact 30A constitutes a barrier layer 12A of commercially available electroless nickel (containing less than 10 percent phosphorus) undercoated with a catalytic layer 11A such as palladium and overcoated with a conductive layer 13A such as silver, which is contiguous with the bottom region 10A and provides a conductive sheet of material to allow buildup of the top region 14A by electroplating techniques. The top region 14A of contact 30A is of gold, and is contiguous with a portion of the middle region 17A.

The contacts 30 and 30A are used primarily to attach leads to the pellet 1 while contact 30A also provides a suitable and convenient interconnection between the diode 7, 8 and other circuit elements which may be embodied in, or associated with, semiconductor body 6.

One detailed example will now be described of a suitable method for forming the metallic contacts 30 and 30A in accordance with the present invention as shown in FIGS. 1 to 4. The respective bottom regions 10 and 10A consisting each of a layer of aluminum are applied, by means well known to those skilled in the art, to the respective interfaces 20, 21 and 22. The pellet 1 and the layers of aluminum 10 and 10A are then heated to a temperature in the range of 300—570° C. for a sufficient time, about 1 hour, to ensure a good, adherent, nonrectifying bond between the pellet 1 and the aluminum layers 10 and 10A.

Figure 2:
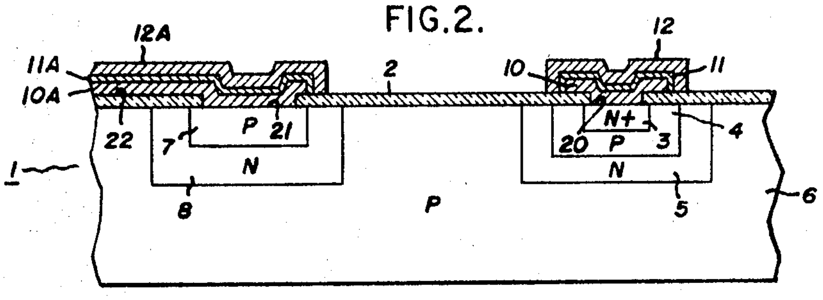

The pellet 1 is then recleaned, for example, by placing it in boiling nitric acid followed by a rinse in deionized water. The middle regions 17 and 17A are then applied to the bottom regions 10 and 10A as follows. When electroless nickel is used for layer 12, the catalytic layers 11 and 11A of palladium, about 50 A. thick, are first applied to the top of aluminum layers 10 and 10A and preferably no place else as shown in FIG. 2. This is accomplished, for example, by immersing the pellet 1 for about 30 seconds in a solution of 15 parts deionized water and 1 part stock palladium chloride activator, i.e. the stock solution consisting of 0.3 grams of the compound $PdCl_2$, 2 ml. of concentrated hydrochloric acid and 998 ml. of deionized water. The palladium layers 11 and 11A provide a catalytic surface (i.e. to facilitate deposition of electroless metal), thus providing a substrate for the top regions 14 and 14A and particularly for the barrier layer 12 and 12A as will hereinafter be described, to form a good bond with the aluminum layers 10 and 10A.

The barrier layers 12 and 12A which are also catalysts, consist of electroless nickel having a thickness in the range of 5,000—50,000 A. and are next applied to cover the monolayers of palladium 11 and 11A as shown in FIG. 2. The preferred practice to apply the electroless nickel layers 12 and 12A is to immerse the pellet 1 in a suitable electroless nickel plating solution such as an agitated solution of 25 percent "Roplate NiM" which is a trade name for an electroless nickel solution manufactured by R. O. Hull Co. of Cleveland, Ohio, and 75 percent deionized water for about 10 minutes per 20,000 A. of electroless nickel.

The barrier layers 12 and 12A are overcoated with the conductive layers 13 and 13A which may be, for example, silver having a thickness in the range of 1,000—5,000 A. by a suitable means such as vacuum deposition. The silver layers 13 and 13A provide conductive sheets of metal that are primarily used during electroplating deposition to build up thick top regions 14 and 14A of a conductive material having a thickness in the range of 20,000—100,000 A.

Figure 3:
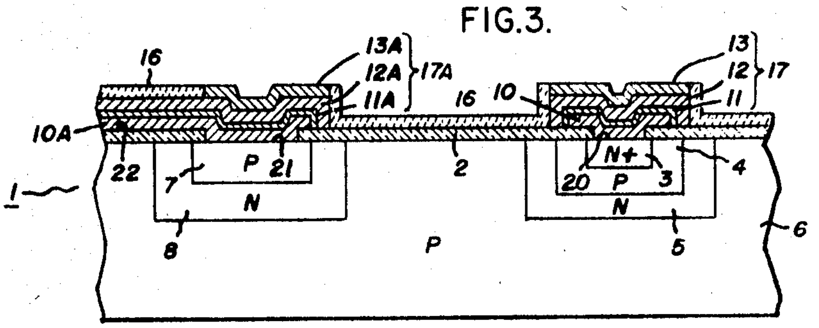

To apply the top regions 14 and 14A of connectable metal such as gold, it is preferable to first place a layer 16 of photoresist material, such as Eastman Kodak's KMER, over those areas of the pellet 1 where no gold is desired, as shown in FIG. 3. This is accomplished by means well known to those skilled in the art. When this is completed, the pellet 1 is immersed in a suitable gold-electroplating bath, such as the solution available commercially as Sel Rex 200, manufactured by Sel-Rex Corporation of Nutley, N.J., until the desired thickness of gold is deposited. Desirably the gold zone 14 should be plated to a thickness of about 60,000 A., which requires a plating time of about 1 hour. The advantage of this method of application is that the gold layers 14 and 14A are selectively deposited only in those areas where the silver layers 13 and 13A are exposed. The photoresist layer 16 is then removed by means well known to those skilled in the art and the newly exposed silver surface is removed in the areas where it is not covered by gold. The preferred method of accomplishing this is to preferentially etch the unwanted silver without attacking the gold in a suitable silver etch by techniques well known to those skilled in the art. It should be noted that metallic contacts 30 and 30A can be used together or separately, depending on the device application.

If desired, the pellet 1 and the bottom, middle and top regions of the metallic contacts 30 and 30A, as shown in FIG. 4, can be heated to a temperature in the range of 300—400° C. for about 30 minutes to increase their adherence to each other.

Figure 5:
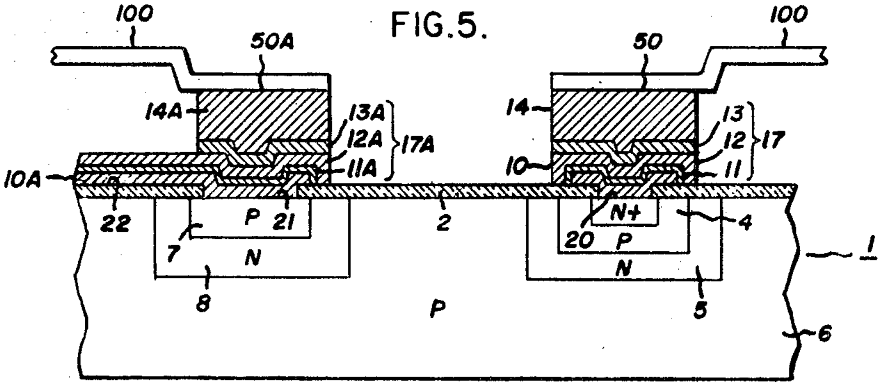
FIG. 5 is a fragmentary cross-sectional view of the semiconductor pellet shown in FIG. 4, with a set of leads secured to the contacts thereof.

FIG. 5 depicts a semiconductor device 1 as shown in FIG. 4 wherein a set of fingers 100 are bonded to the respective raised metallic contacts 30 and 30A. To effect the bonding of the contacts 30 and 30A to the leads 100 which may be, for example, tin-plated copper, each lead 100 is pressed against the top surface 50 of the layers 14 and 14A of the respective contacts 30 and 30A by a suitable bonding means such as a heated bonding member. The resultant heating and pressure causes the tin on each lead 100 and gold of top regions 14 and 14A to flow together and form a nonrectifying, adherent bond.

Figure 6:
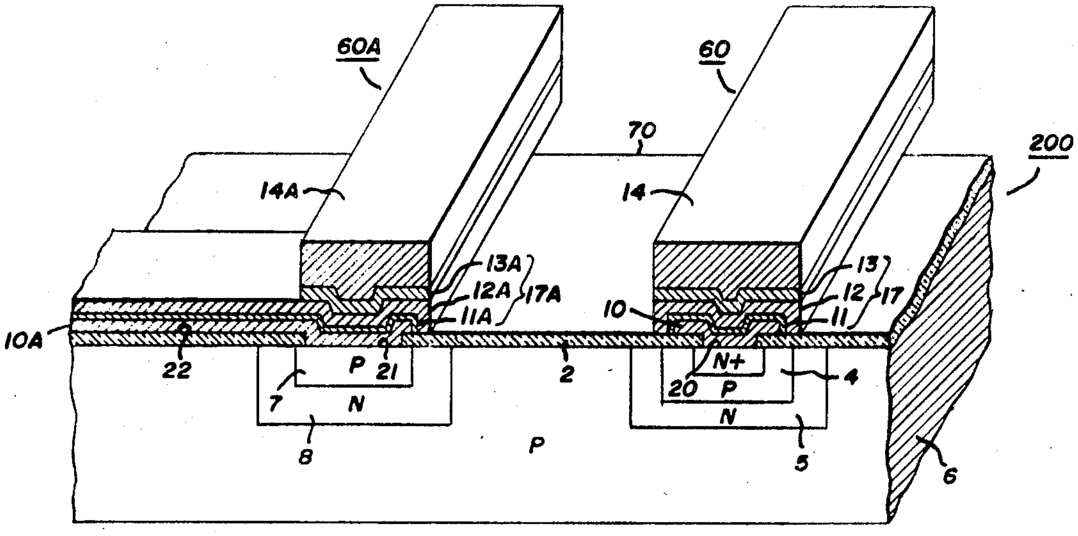
FIG. 6 shows a fragmentary three-dimensional view of another embodiment of this invention.

FIG. 6 shows a fragmentary three-dimensional view of another semiconductor device 200 with a metallic contact according to this invention similar to that shown in FIG. 4 with the exception that the contacts 60 and 60A extend, cantilever-beam fashion, past the edge of the pellet 70.

The processing steps and materials used to form the metallic contacts 60 and 60A in FIG. 6 are identical to those already described in explaining the manufacture of the device shown in FIGS. 1 to 4 with the following exception. Each of the pellets 200 are separated from the wafer holding them together before pelletizing by masking and etching away (using techniques that are well known to those skilled in the art) the silicon around those portions of the contacts 60 and 60A that extend past the edge of the pellet 70.

In summary, this invention provides a metallic contact system that can be used both on discrete and integrated circuit type devices. It is equally applicable for use on N-type conductivity silicon, P-type conductivity silicon, and on insulating protective and junction sealing layers such as silicon dioxide, glass and silicon nitride or combinations thereof. Its simplicity and ease of fabrication also provides a low cost method of producing "beam-lead" type contacts or other type contacts having lead connection surfaces raised above the surrounding areas. Finally, this invention has the advantage of being applicable to many of the contact systems having a top layer of aluminum already in use and does not require a complete overhaul of a contact process but rather adds just a few additional steps.

It will be appreciated by those skilled in the art that the invention may be carried out in various forms and embodiments heretofore described. Accordingly, it is to be understood that the scope of the invention is not limited by the details of the foregoing description, but will be defined in the following claims.

What we claim as new and desire to secure by Letters Patent of the United States is:

1. A semiconductor device comprising a body of semiconductor material having an insulating layer covering at least a portion of said body and provided with a contact-locating aperture exposing a portion of the surface of said body; and a metallic contact on said body having a bottom region comprising one or more metals from the group consisting of titanium, aluminum and intermetallic compounds of titanium and aluminum contiguous with said exposed surface; the top surface of said bottom region being aluminum; a top region in said contact of gold; and a middle region in said contact between said bottom region and said top region and including a layer of barrier metallic material; said layer of barrier metallic material consisting of a layer of electroless nickel undercoated with palladium and overcoated with silver.

2. A semiconductor device comprising a body of semiconductor material having an insulation layer covering at least a portion of said body and provided with a contact-locating aperture exposing a portion of the surface of said body; and a metallic contact thereon having a bottom region comprising one or more metals from the group up consisting of titanium, aluminum and intermetallic compounds of titanium and aluminum contiguous with said exposed surface and at least a portion of the surface of the insulating layer; the top surface of said bottom region being aluminum; a top region in said contact of gold; and a middle region in said contact between said bottom region and said top region and including a layer of barrier metallic material; said layer of barrier metallic material consisting of a layer of electroless nickel undercoated with palladium and overcoated with silver.

3. A semiconductor device comprising a body of semiconductor material having an insulating layer covering at least a portion of said body and provided with a contact-locating aperture exposing a portion of the surface of said body; and a metallic contact on said body having a bottom region comprising one or more metals from the group consisting of titanium, aluminum and intermetallic compounds thereof contiguous with said exposed surface and forming a conductive path bonded to said insulating layer extending across at least a portion of said insulating layer and having at least a portion of said contact extending beyond the edge of said body; the top surface of said bottom region being aluminum; a top region in said contact of gold; and a middle region in said contact between said bottom region and said top region and including a layer of barrier metallic material; said barrier metallic material consisting of a layer of electroless nickel undercoated with palladium and overcoated with silver.

4. A semiconductor device comprising a body of semiconductor material having an insulating layer covering at least a portion of said body including a layer of silicon dioxide and a layer of silicon nitride, and said insulating layer is provided with a contact-locating aperture exposing a portion of the surface of said body; and a metallic contact thereon having a bottom region comprising one or more metals from the group consisting of titanium, aluminum and intermetallic compounds thereof contiguous with said exposed surface; the top surface of said bottom region being aluminum, a middle region in said contact contiguous with said bottom region including a barrier layer of electroless nickel overcoated with a conduction layer of silver and undercoated with a catalytic layer of palladium; and a top region in said contact of connectable material contiguous with at least a portion of said middle region consisting of a layer of gold.

5. A semiconductor device as recited in claim 4 wherein said insulating layer includes a layer of glass.

6. A semiconductor device comprising a body of semiconductor material having an insulating layer covering at least a portion of said body and provided with a contact-locating aperture exposing a portion of the surface of said body; and metallic contact on said body including a bottom region comprising one or more metals from the group consisting of titanium, aluminum and intermetallic compounds of titanium and aluminum contiguous with said exposed surface; said bottom region having a top surface of aluminum; a top region in said contact comprising one or more metals from the group consisting of gold, silver, tin, lead and intermetallic compounds thereof; and a middle region in said contact between and directly contiguous with said bottom region and said top region and including a layer of electroless nickel; said layer of electroless nickel having an undercoating of palladium.